United States Patent
Ogawa et al.

(10) Patent No.: US 7,652,935 B2
(45) Date of Patent: Jan. 26, 2010

(54) SEMICONDUCTOR MEMORY DEVICE CAPABLE OF ACHIEVING NARROWER DISTRIBUTION WIDTH OF THRESHOLD VOLTAGES OF MEMORY CELLS AND METHOD OF DATA WRITE IN THE SAME

(75) Inventors: Tomoya Ogawa, Tokyo (JP); Takashi Ito, Tokyo (JP); Hidenori Mitani, Tokyo (JP); Takashi Kono, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 137 days.

(21) Appl. No.: 12/076,787

(22) Filed: Mar. 24, 2008

(65) Prior Publication Data
US 2008/0239826 A1 Oct. 2, 2008

(30) Foreign Application Priority Data
Mar. 30, 2007 (JP) .............................. 2007-092352

(51) Int. Cl.
*G11C 7/22* (2006.01)
(52) U.S. Cl. .............................. 365/189.16; 189/185.22; 189/230.03

(58) Field of Classification Search ............ 365/189.16, 365/189.05, 189.07, 185.22, 230.03
See application file for complete search history.

(56) References Cited

U.S. PATENT DOCUMENTS

| | | | |
|---|---|---|---|
| 6,157,983 A | 12/2000 | Lee et al. | |
| 6,347,063 B1* | 2/2002 | Dosaka et al. | 365/189.17 |
| 6,496,418 B2* | 12/2002 | Kawahara et al. | 365/185.24 |
| 7,310,270 B2* | 12/2007 | Tanaka et al. | 365/185.17 |
| 2002/0181289 A1* | 12/2002 | Matsubara et al. | 365/185.33 |

* cited by examiner

*Primary Examiner*—Tuan T. Nguyen
(74) *Attorney, Agent, or Firm*—McDermott Will & Emery LLP

(57) ABSTRACT

When a data write sequence is started, initially, write data is latched in a data latch circuit corresponding to one memory mat. Then, a program pulse is applied to the memory mat, and data read from a memory cell, which is a data write target bit in the memory mat, is performed. Thereafter, verify determination of the memory mat is performed. After a verify operation for the memory mat is completed, a program pulse is applied to another memory mat, and a verify operation for another memory mat is performed.

8 Claims, 9 Drawing Sheets

FEEDING CURRENT i TO 8 MEMORY CELLS IN
MODEL ABOVE, GND INCREASES AT D POINT BY
$8i \times R + 7i \times R + 6i \times R + \ldots + i \times R = 36iR$

SEMICONDUCTOR MEMORY DEVICE CAPABLE OF ACHIEVING NARROWER DISTRIBUTION WIDTH OF THRESHOLD VOLTAGES OF MEMORY CELLS AND METHOD OF DATA WRITE IN THE SAME

BACKGROUND OF THE INVENTION

1. Field of the Invention

The present invention relates to a semiconductor memory device, and more particularly to a flash memory capable of non-volatile data storage and a method of data write in the same.

2. Description of the Background Art

Conventionally, in storing data in a flash memory capable of non-volatile data storage, in a data write sequence, information of data "0" or "1" can be stored by applying a program pulse to a memory cell transistor of a memory cell in accordance with externally input data and varying a threshold voltage of the memory cell transistor utilizing channel hot electron (CHE) or Fowler-Nordheim (FN) tunneling.

In order to confirm whether storage of information of desired data has been performed or not, in the data write sequence, verify determination for determining whether desired data has been written or not is performed by performing data read after data write, and the program pulse is applied again (verify write) until it is determined that desired data has been written, that is, until verify passes. Specifically, a threshold voltage for determination (also referred to as program verify) is provided between a threshold voltage corresponding to data "0" and a threshold voltage corresponding to data "1", and to which side the threshold voltage of the memory cell transistor has shifted is determined. For example, it is assumed in the present example that the threshold voltage corresponding to data "0" is lower than program verify and the threshold voltage corresponding to data "1" is higher than program verify. It is assumed herein that data write and verify write in which the program pulse is applied to the memory cell transistor are collectively also referred to as program write.

According to a general data write sequence, the program pulses are applied again to data write target bits, that is, a plurality of memory cell transistors for which program write is performed in parallel, until verify of all memory cell transistors passes, for example, until the threshold voltages of the memory cell transistors are shifted to a level not lower than program verify.

Here, for example, if a bit (memory cell transistor) latest in the shift of the threshold voltage is present, the program pulse should be applied also to that bit a plurality of times until the threshold voltage thereof is shifted to the level not lower than program verify. Namely, the number of data write target bits into which data should be written increases, threshold voltages of the memory cell transistors are distributed over a wider area.

FIG. 8 illustrates spread of distribution of threshold voltages of memory cell transistors.

FIG. 8 shows threshold voltage Vth distribution (a) when the number of bits to be verified is small in an identical data write sequence.

In addition, FIG. 8 shows threshold voltage Vth distribution (b) when the number of bits to be verified is great in an identical data write sequence.

As can clearly be seen from comparison of threshold voltage Vth distributions (a) and (b) with each other, when the number of bits to be verified is great, threshold voltages Vth are distributed over a range wider than when the number of bits to be verified is small.

In addition, FIG. 8 shows threshold value distribution (c) in an example where a bit extremely late in the shift of threshold voltage Vth is present when the number of bits to be verified is great in an identical data write sequence. Here, a sign "x" represents a bit late in the shift of threshold voltage Vth. In such a case, as the program pulse is applied a plurality of times until program verify of the bit latest in the shift passes, distribution of threshold voltages Vth is significantly distant from a program verify threshold voltage Vthp.

From a point of view of spread of distribution of threshold voltages Vth of memory cell transistors, this means that a memory cell transistor of which threshold voltage Vth is in a high region is great in a shift amount of threshold voltage Vth.

In other words, deterioration of a memory cell transistor great in the shift amount is more likely because an amount of electrons or holes passing through an insulating film is great, and reliability of the memory cell transistor may not be compensated for.

Therefore, a technique to perform program write separately for data write target bits into which data should be written has been disclosed. Specifically, U.S. Pat. No. 6,157, 983 shows a technique to divide a memory array into a plurality of sub arrays and performing program write in parallel for respective sub arrays.

The publication above, however, shows an example where the memory array is divided into the plurality of sub arrays and program write is performed in parallel for respective sub arrays. Here, if program write is performed at a time on the entire sub arrays (entire mat), an amount of current fed at a time (write current amount) becomes great.

In particular, when program write into a flash memory is performed, program write by applying a high voltage (for example, 7V) and injecting channel hot electron (CHE) is performed. Therefore, supply capability of a charge pump boosting a normal power supply voltage VDD (for example, 1.5V) is important. In this regard, if the amount of current (amount of write current) fed at a time is great, supply capability of the charge pump should inevitably be great and a layout area of the charge pump is made larger.

From the viewpoint of noise, in general, as more current is fed, voltage drop due to parasitic resistance or coupling noise due to parasitic capacitance is caused.

FIG. 9 illustrates voltage drop due to parasitic resistance when a current i is simultaneously fed to a plurality of memory cell transistors.

FIG. 9 exemplarily shows eight memory cells (memory cell transistors) MC on which program write is performed in parallel, and current i passes through each memory cell transistor MC here. Resistor R represents parasitic resistance or the like.

Here, when current i flows through eight memory cells in parallel, for example, a potential difference by $36i \times R$ is produced between a D point and an ideal GND, and GND may increase by $36i \times R$.

Namely, with the increase in ground voltage GND, variation in current i that flows through the memory cell transistors may be caused between the memory cell transistor corresponding to the D point at the right end of the page and the memory cell transistor corresponding to the left end of the page.

Therefore, when program write is performed at a time on the entire sub arrays (entire mat), the number of data write target bits for which program write is to be performed in parallel is increased. Consequently, ground voltage GND may be raised and variation in write may be caused.

FIGS. 10A and 10B illustrate coupling noise between signal lines.

Referring to FIG. 10A, a configuration in which drivers DR1 and DR2 are provided on opposing ends of a signal line PA and drivers DR3 and DR4 are provided on opposing ends of a signal line PB is shown here.

Specifically, an example where a signal is transmitted from driver DR1, DR3 in a preceding stage through signal line PA, PB to driver DR2, DR4 in a subsequent stage is shown.

As shown in FIG. 10B, when driver DR1 drives the signal from "L" level to "H" level via signal line PA, a voltage level of signal line PB is raised in accordance with a parasitic capacitance CA between signal line PA and signal line PB. That is, coupling noise is produced.

Therefore, when program write is performed at a time on the entire sub arrays (entire mat), coupling noise level becomes higher and resistance to noise may lower.

SUMMARY OF THE INVENTION

The present invention was made to solve the above-described problems, and an object of the present invention is to provide a semiconductor memory device capable of achieving a narrower distribution width of threshold voltages and lower noise as well as a method of data write in the same.

According to one embodiment of the present invention, a semiconductor memory device includes a memory array having a plurality of memory cells and divided into first and second memory mats, and a selection circuit designating prescribed areas having an identical address, of the respective first and second memory mats of the memory array, that are data write targets, based on external address input. In addition, the semiconductor memory device includes first and second data latch portions holding first and second write data groups defining application of program pulses to memory cells in the prescribed areas of the first and second memory mats designated by the selection circuit, respectively. In addition, the semiconductor memory device includes first and second write drivers provided corresponding to the first and second data latch portions respectively, for applying the program pulses to the memory cells included in the selected prescribed areas in accordance with the first and second write data groups. In addition, the semiconductor memory device includes a write/verify control portion for controlling at least one of the first and second write drivers to perform data write and verify write in which the program pulse is applied to the memory cell included in the selected prescribed area, and a sense amplifier portion for performing data read after data write and verify write into the memory cell included in the selected prescribed area that is the data write target. The write/verify control portion gives an instruction to perform data write into the prescribed area of one of the first and second memory mats based on the write data group held in one of the first and second data latch portions. Then, the write/verify control portion repeatedly gives an instruction to perform verify write into the memory cell included in the selected prescribed area until verify is completed, based on a result of verify obtained based on comparison between a data group read by the sense amplifier portion from the memory cell included in the selected prescribed area and the write data group. In a write sequence, the write/verify control portion gives an instruction to perform data write into the memory cell included in the prescribed area of the second memory mat after verify of the memory cell included in the prescribed area of the first memory mat is completed.

According to one embodiment as such, in the semiconductor memory device, the memory array is divided into the first and second memory mats, and the program pulse is applied to the memory cell in the prescribed area of the first memory mat. After verify of the memory cell included in the prescribed area of the first memory mat is completed, the program pulse is applied to the memory cell included in the prescribed area of the second memory mat. Therefore, an amount of write current that flows at a time can be suppressed, it is not necessary to enhance supply capability of the charge pump, and a layout area can also be made smaller. In addition, from a viewpoint of noise as well, as data is not recorded at once into the entire memory mat, voltage drop or noise such as coupling noise due to parasitic capacitance can be suppressed. Moreover, as the verify operation is performed in each memory mat, distribution width of the threshold voltages can be narrowed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
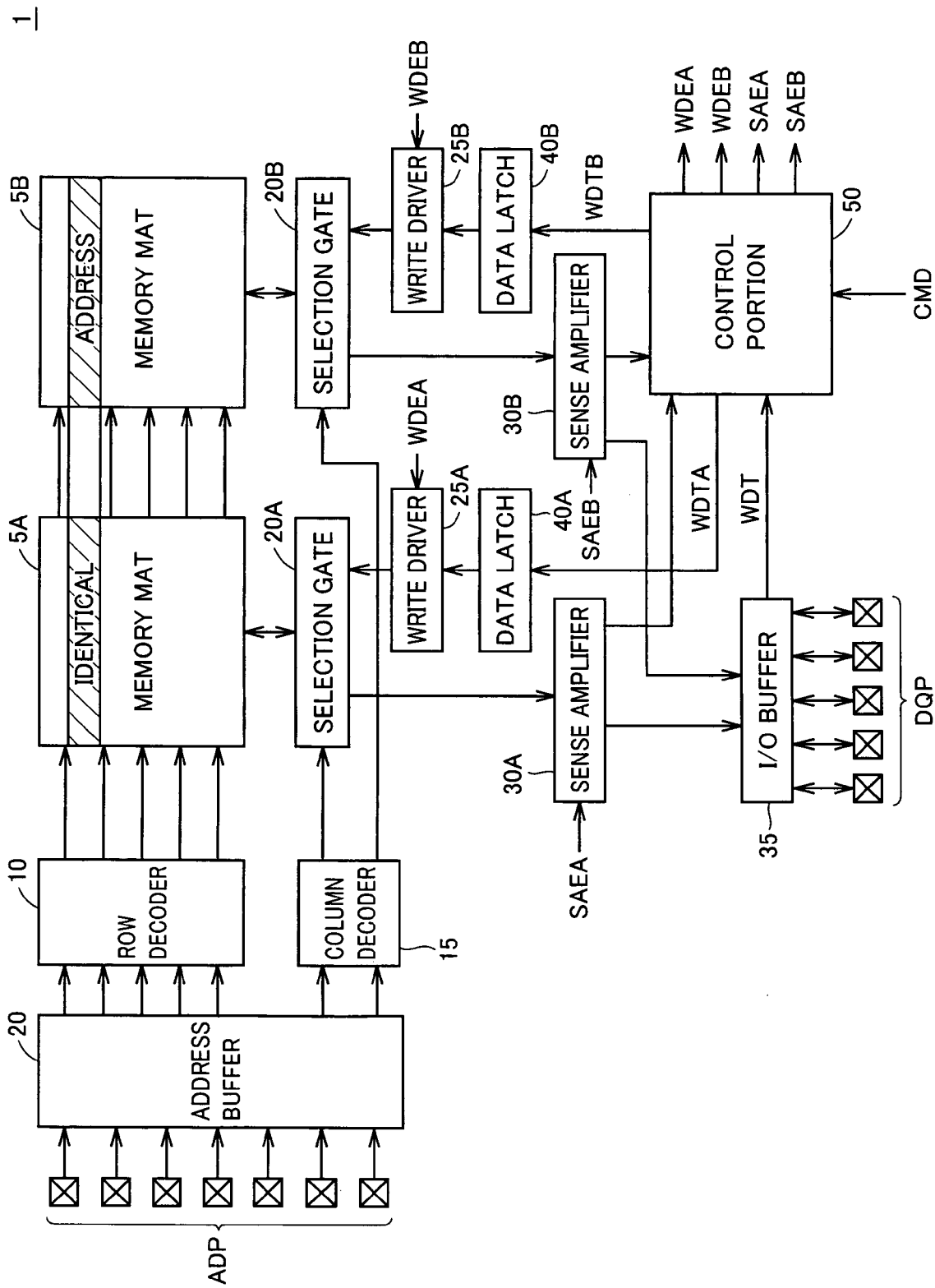
FIG. 1 is a schematic block diagram of a non-volatile semiconductor memory device according to an embodiment of the present invention.

An embodiment of the present invention will be described hereinafter in detail with reference to the drawings. In the drawings, the same or corresponding elements have the same reference characters allotted, and description thereof will not be repeated.

First Embodiment

Referring to FIG. 1, a non-volatile semiconductor memory device 1 according to an embodiment of the present invention includes memory mats 5A, 5B including a not-shown plurality of memory cells (memory cell transistors) arranged in an integrated manner in matrix of rows and columns, and a plurality of word lines provided corresponding to memory cell rows respectively and a plurality of bit lines provided corresponding to memory cell columns respectively. It is noted that memory mats 5A, 5B are obtained by dividing a memory array into two.

In addition, non-volatile semiconductor memory device 1 further includes a row decoder 10 and a column decoder 15 for selecting the plurality of word lines and the plurality of bit lines respectively, and an address buffer 20 for buffering an address signal externally input through an address pin ADP and transmitting the address signal to row decoder 10 and column decoder 15.

Moreover, non-volatile memory device 1 further includes sense amplifier bands 30A, 30B amplifying data read from memory mats 5A, 5B, and an I/O buffer 35 outputting the data amplified by sense amplifier bands 30A, 30B to outside or buffering data externally input through a data pin DQP to output the data to a control portion 50. Each of sense amplifier bands 30A, 30B is provided with sense amplifier(s) (SA) in the number corresponding to the number of data read target bits from which data can be read in parallel. In addition, in the present example, I/O buffer 35 receives input of write data (write data group) for performing program write into memory mats 5A, 5B designated by an identical address based on an address signal through data pin DQP. In the present example, a case where write data (write data group) for performing program write into memory mats 5A, 5B are simultaneously input is described, however, write data (write data group) for performing program write into memory mats 5A, 5B may be input independently.

In addition, non-volatile memory device 1 includes data latch circuits 40A, 40B provided corresponding to memory mats 5A, 5B respectively, for holding write data (write data groups) defining application of program pulses to memory cells selected based on an address in memory mats 5A, 5B. Moreover, non-volatile memory device 1 includes write driver bands 25A, 25B provided corresponding to data latch circuits 40A, 40B respectively, for applying the program pulses to the memory cells selected based on the address in memory mats 5A, 5B in accordance with the write data groups held in data latch circuits 40A, 40B. Non-volatile memory device 1 further includes control portion 50 for controlling overall non-volatile memory device 1. Each of write driver bands 25A and 25B is provided with write driver(s) (WD) in the number corresponding to the number of data write target bits into which data can be written in parallel.

In addition, non-volatile semiconductor memory device 1 further includes selection gates 20A, 20B operating in response to a selection instruction from column decoder 15 and controlling electrical connection between the selected bit line and sense amplifier band 30A, 30B or write driver band 25A, 25B.

Control portion 50 processes an internal circuit or outputs a control signal in response to an external command CMD. Specifically, for example, control portion 50 outputs as necessary an activation signal for activating write driver band 25A, 25B for performing data write or verify write in a data write sequence. In addition, control portion 50 outputs as necessary an activation signal for activating sense amplifier band 30A, 30B for performing data read. Then, control portion 50 performs verify determination which will be described later in accordance with read data from sense amplifier band 30A, 30B and gives an instruction to perform verify write based on a result of verify. Moreover, receiving input of data WDT from I/O buffer 35, control portion 50 outputs a part of data WDT to data latch circuit 40A as write data WDTA to memory mat 5A at prescribed timing and outputs remainder of data WDT to data latch circuit 40B as write data WDTB to memory mat 5B.

Figure 2:
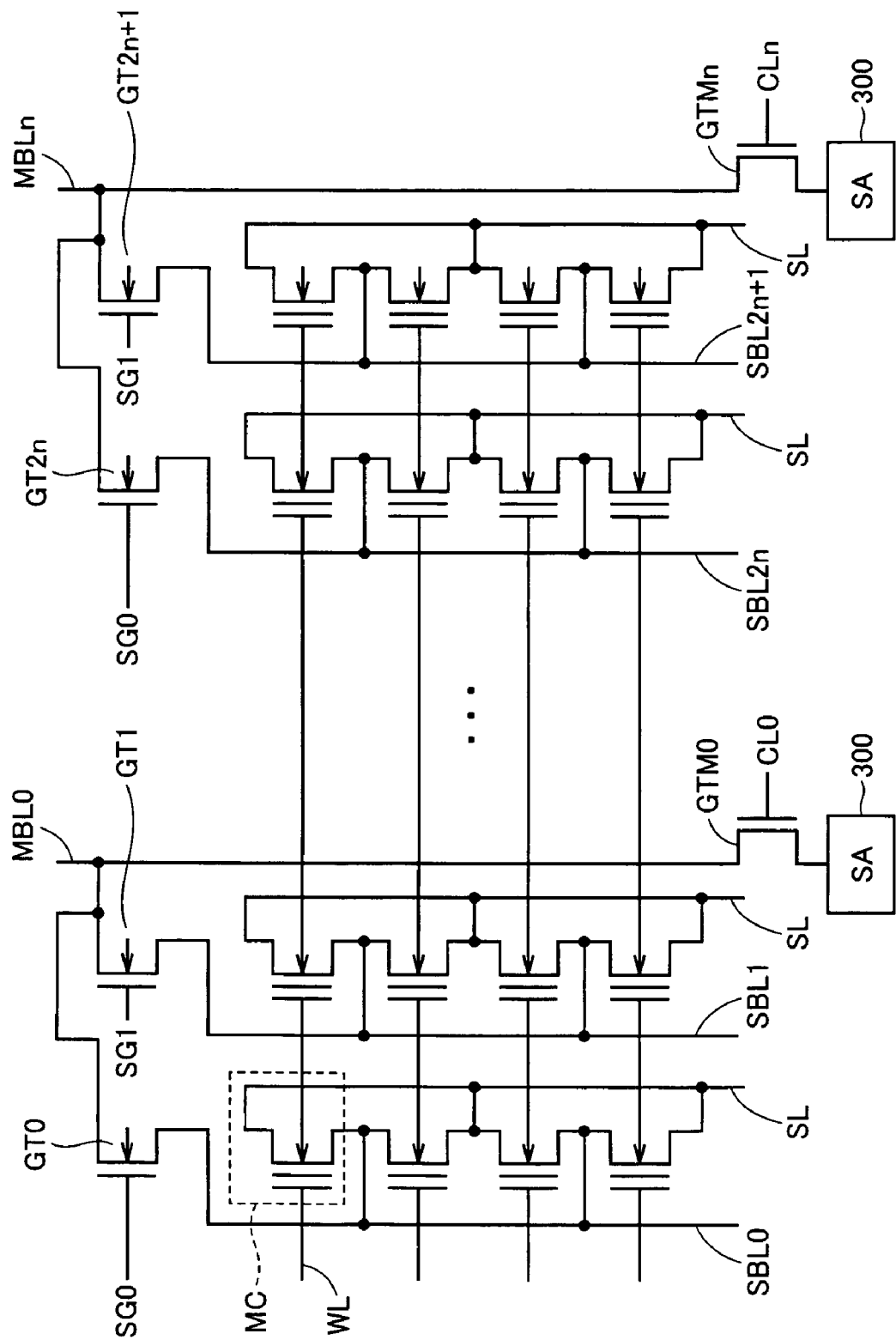
FIG. 2 illustrates a partial configuration of a memory mat.

Referring to FIG. 2, memory mat 5A according to the embodiment of the present invention includes a plurality of memory cells (memory cell transistors) MC capable of non-volatile data storage, arranged in an integrated manner in matrix of rows and columns, a plurality of word lines WL provided corresponding to memory cell rows respectively, and a plurality of bit lines provided corresponding to memory cell columns respectively. Here, memory cells different in threshold voltages depending on stored data are shown as exemplary memory cells MC.

According to the configuration in FIG. 2, sub bit lines SBL are provided corresponding to the memory cell columns respectively and a main bit line is provided for each set of the plurality of sub bit lines.

In the present example, a configuration where a main bit line MBL is provided corresponding to two sub bit lines SBL is exemplarily shown. Specifically, an example where a main bit line MBL0 is provided corresponding to sub bit lines SBL0, SBL1, and main bit line MBLn is provided corresponding to sub bit lines SBL2$n$, SBL2$n$+1 (n: natural number not smaller than 1) is shown.

In addition, a gate transistor implementing selection gate 20A is provided between sub bit line SBL and main bit line MBL. In the present example, gate transistors GT0, GT1 are provided between sub bit lines SBL0, SBL1 and main bit line MBL0, and they are turned on in response to control signals SG0, SG1 respectively. In addition, similarly, gate transistors GT2$n$, GT2$n$+1 are provided between sub bit lines SBL2$n$, SBL2$n$+1 and main bit line MBLn, and they are turned on in response to control signals SG0, SG1 respectively.

In addition, in the present example, sense amplifiers (SA) 300 are provided in the number corresponding to the number of main bit lines MBL. In FIG. 2, an example where sense amplifiers (SA) 300 are provided corresponding to main bit lines MBL0, MBLn respectively, and column selection gates GTM0, GTMn implementing the selection gates are provided between the sense amplifiers and main bit lines MBL0, MBLn respectively is shown. Column selection gates GTM0, GTMn are turned on in response to control signals CL0, CLn, respectively. It is assumed here that control signals SG, CL are output from column decoder 15 based on the address signal output from address buffer 20.

For example, column decoder 15 outputs control signal SG0 and control signals CL0, CLn in accordance with the address signal transmitted from address buffer 20. Accordingly, gate transistors GT0, GT2$n$ are turned on, and column selection in accordance with the input address signal (column selection) can be carried out. In the present example, a configuration where parallel n+1-bit data write and data read is allowed is shown.

Though main bit lines MBL0, MBLn are exemplarily described in the present example, other main bit lines and the like are also applicable without limited thereto. In addition, though a case where two sub bit lines are provided is described in the present example, a configuration in which a greater number of sub bit lines SBL and main bit line MBL are electrically coupled may be possible.

Though the configuration of memory mat 5A is described here, the configuration of memory mat 5B is also similar.

Control portion 50 according to the embodiment of the present invention will be described with reference to FIG. 3.

Figure 3:
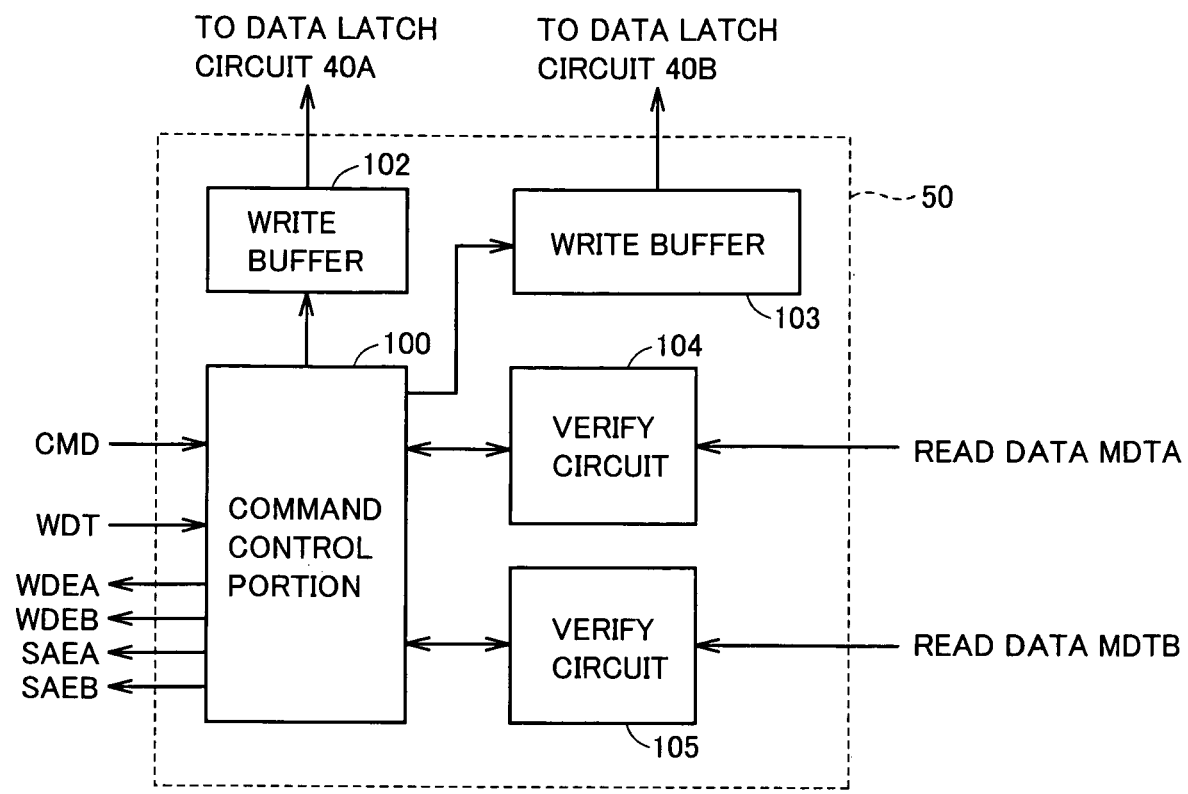
FIG. 3 is a schematic block diagram illustrating a control portion according to the embodiment of the present invention.

Referring to FIG. 3, control portion 50 according to the embodiment of the present invention includes a command control portion 100, write buffers 102, 103, and verify circuits 104, 105. Command control portion 100 has a function to control at least one of write drivers 25A, 25B provided corresponding to memory mats 5A, 5B respectively to perform data write and verify write in which the program pulse is applied to the memory cell included in a selected prescribed area.

Command control portion 100 outputs a control signal to the internal circuit in response to external input of command CMD. For example, in carrying out the data write sequence in accordance with the embodiment of the present invention, in order to give an instruction to perform data write and verify write, command control portion 100 outputs an activation signal WDEA activating write driver band 25A provided corresponding to memory mat 5A. In addition, in order to give an instruction to perform data write and verify write, command control portion 100 outputs an activation signal WDEB activating write driver band 25B provided corresponding to memory mat 5B. Then, in data read after data write and verify write, command control portion 100 outputs an activation signal SAEA activating sense amplifier band 30A provided corresponding to memory mat 5A. In addition, in data read after data write and verify write, command control portion 100 outputs an activation signal SAEB activating sense amplifier band 30B provided corresponding to memory mat 5B.

In addition, command control portion 100 has a latch function to latch input write data WDT, and outputs a part of data WDT input from I/O buffer 35 to write buffer 102 as write data WDTA for memory mat 5A at prescribed timing and outputs a remaining part of data WDT from I/O buffer 35 to write buffer 103 as write data WDTB for memory mat 5B.

Receiving input of write data WDTA input via command control portion 100, write buffer 102 buffers write data WDTA and outputs the same to data latch circuit 40A.

In addition, receiving input of write data WDTB input via command control portion 100, write buffer 103 buffers write data WDTB and outputs the same to data latch circuit 40B.

Verify circuit 104 performs verify determination in which read data MDTA (read data group) read from memory mat 5A at the time of data read after data write and verify write is compared with write data WDTA provided from command control portion 100, and outputs a result of verify determination to command control portion 100.

Verify circuit 105 performs verify determination in which read data MDTB (read data group) read from memory mat 5B at the time of data read after data write and verify write is compared with write data WDTB provided from command control portion 100, and outputs a result of verify determination to command control portion 100.

Receiving input of the results of verify determination from verify circuits 104, 105, command control portion 100 outputs activation signals WDEA, WDEB activating respective write driver bands 25A, 25B for performing verify write in which the program pulse is applied again, based on the results of determination.

Activated upon receiving respective inputs of write control signals WDEA, WDEB, write driver bands 25A, 25B apply the program pulses based on data stored in data latch circuits 40A, 40B to the memory cell transistors that are the data write target bits.

A data write sequence of the non-volatile semiconductor memory device according to the embodiment of the present embodiment will now be described.

The data write sequence of the non-volatile semiconductor memory device according to the first embodiment of the present invention will be described with reference to FIG. 4.

Figure 4:
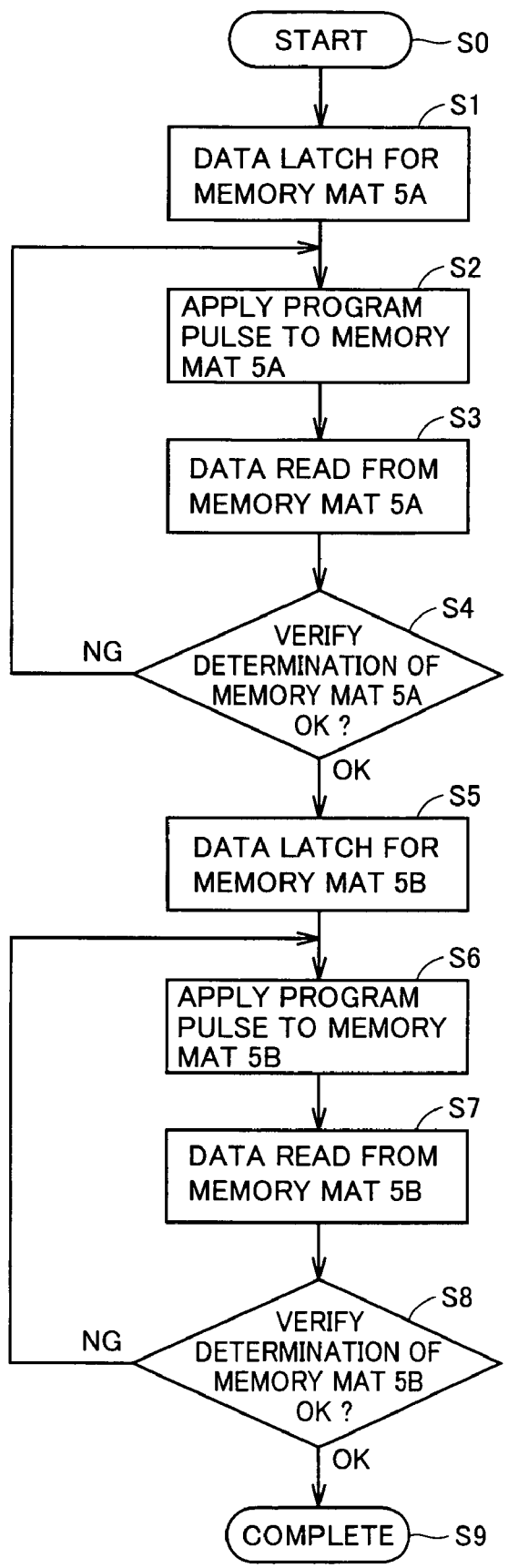
FIG. 4 is a flowchart illustrating a data write sequence of the non-volatile semiconductor memory device according to a first embodiment of the present invention.

Referring to FIG. 4, in the data write sequence according to the embodiment of the present invention, data storage into the memory cell is performed for each mat that is obtained by dividing the memory array into a plurality of memory mats. In addition, it is assumed that, in the data write sequence according to the embodiment of the present invention, a selection operation is performed on the plurality of memory mats based on designation of an identical address in response to the input address signal.

Initially, when the data write sequence is started (step S0), first, write data WDTA is latched in data latch circuit 40A corresponding to memory mat 5A (step S1). Namely, command control portion 100 outputs write data WDTA to write buffer 102. Then, it is assumed that write data WDTA for data write is output from write buffer 102 to data latch circuit 40A and held in data latch circuit 40A.

Thereafter, the program pulse is applied to memory mat 5A (step S2). Here, it is assumed that row selection by row decoder 10 and column selection by column decoder 15 for memory mat 5A are performed in response to the input address signal. Command control portion 100 outputs activation signal WDEA to write driver band 25A. In response to this, write driver band 25A performs parallel data write into the selected row in memory mat 5A that has been selected by row decoder 10 via selection gate 20A, in accordance with write data WDTA latched in data latch circuit 40A. In the data write sequence according to the embodiment of the present invention, the selection operation is performed on the plurality of memory mats based on designation of the identical address in response to the input address signal. Therefore, in memory mat 5B as well, row selection by row decoder 10 and column selection by column decoder 15 are performed as in memory mat 5A, however, data write to memory mat 5B is not performed in parallel.

Thereafter, data read from the memory cell which is the data write target bit of memory mat 5A is performed (step S3). Namely, a verify operation in which data read and verify determination of memory mat 5A are carried out is performed. Command control portion 100 outputs activation signal SAEA to sense amplifier band 30A. In response to this, sense amplifier band 30A performs parallel data read from the memory cells, that are the data write target bits, via selection gate 20A. The data read by sense amplifier 30A is input to verify circuit 104 as read data MDTA.

Thereafter, verify determination of memory mat 5A is performed and whether verify determination is OK or not (whether verify passes (is complete) or not) is determined (step S4).

If verify determination of memory mat 5A is OK in step S4, the process proceeds to next step S5. If verify determination is NG, the process returns to step S2.

Here, whether verify determination of memory mat 5A is OK or not is determined based on comparison, that is, based on whether read data MDTA output from sense amplifier band 30A and received by verify circuit 104 matches with write data WDTA from command control portion 100. It the data match, verify determination is OK, as it has been determined that desired data write to the memory cell which is the data write target bit had been completed, and if the data do not match, verify determination is NG.

In step S4, if verify determination of at least one memory cell which is the data write target bit of memory mat 5A is NG, the process returns to step S2 and verify write in which the program pulse described above is applied is performed again. Specifically, command control portion 100 outputs activation signal WDEA to write driver band 25A for performing verify write, based on verify determination (result of verify) from verify circuit 104.

Then, step S2 to step S4 are repeated until verify determination of all memory cells that are the data write target bits of memory mat 5A is finally OK, and after verify is completed, the process proceeds to next step S5.

Thereafter, in step S5, write data WDTB is latched in data latch circuit 40B corresponding to memory mat 5B. Specifically, command control portion 100 outputs write data WDTB to write buffer 103. Then, it is assumed that write data WDTB for data write is output from write buffer 103 to data latch circuit 40B and held in data latch circuit 40B. In the present example, a configuration in which write data WDTB for data write is output from write buffer 103 to data latch circuit 40B and data latch circuit 40B latches the data after step S4 is described, however, the order (timing) is not particularly limited as such, and processing in step S5 may be performed at any time before step S6 in which the program pulse is applied to memory mat 5B. For example, processing in step S5 may be performed after step S1. Alternatively, step S5 may be performed before step S1. In addition, in the present example, a configuration in which write data WDTA, WDTB are output from write buffers 102, 103 to data latch circuits 40A, 40B at different timing respectively is described, however, the configuration may be such that write data WDTA, WDTB may be output to data latch circuits 40A, 40B at the same timing.

Thereafter, the program pulse is applied to memory mat 5B (step S6). Here, as described above, row selection by row decoder 10 and column selection by column decoder 15 for memory mat 5B has been performed in response to the input address signal. Command control portion 100 outputs activation signal WDEB to write driver band 25B. In response to this, write driver band 25B performs parallel data write into the selected row in memory mat 5B that has been selected by row decoder 10, via selection gate 20B in accordance with write data WDTB latched in data latch circuit 40B.

Thereafter, data read from the memory cell which is the data write target bit of memory mat 5B is performed (step S7). Namely, a verify operation in which data read and verify determination of memory mat 5B are carried out is performed. Command control portion 100 outputs activation signal SAEB to sense amplifier band 30B. In response to this, sense amplifier band 30B performs parallel data read from the memory cells that are the data write target bits, via selection gate 20B. The data read by sense amplifier 30B is input to verify circuit 105 as read data MDTB.

Thereafter, verify determination of memory mat 5B is performed and whether verify determination is OK or not (verify passes (is complete) or not) is determined (step S8).

If verify determination of memory mat 5B is OK in step S8, the process proceeds to next step S9 and the data write sequence ends (is completed). On the other hand, if verify determination is NG in step S8, the process returns to step S6.

Here, whether verify determination of memory mat 5B is OK or not is determined based on comparison, that is, based on whether read data MDTB output from sense amplifier band 30B and received by verify circuit 105 matches with write data WDTB from command control portion 100. It the data match, verify determination is OK, as it has been determined that desired data write to the memory cell which is the data write target bit had been completed, and if the data do not match, verify determination is NG.

In step S8, if verify determination of at least one memory cell which is the data write target bit of memory mat 5B is NG, the process returns to step S6 and verify write in which the program pulse described above is applied is performed again. Specifically, command control portion 100 outputs activation signal WDEB to write driver band 25B for performing verify write, based on verify determination (result of verify) from verify circuit 105.

Then, step S6 to step S8 are repeated until verify determination of all memory cells that are the data write target bits of memory mat 5B is finally OK, and after verify is completed, the process proceeds to next step S9.

Therefore, the data write sequence according to the first embodiment of the present invention is such that data storage in the memory cells in memory mat 5B is performed after data storage in the memory cells in memory mat 5A is completed. Namely, when there are a plurality of memory mats obtained by dividing the memory array, data storage in the memory cells in each memory mat is sequentially performed.

In other words, the memory array is divided into a plurality of memory mats and data storage is performed for each memory mat. Therefore, the number of data write target bits can be decreased and spread of distribution of threshold voltages Vth can be suppressed.

In addition, as program write is not performed at a time over the entire memory mat, an amount of the current (write current amount) that flows at a time is not excessively large, it is not necessary to enhance supply capability of the charge pump, and increase in the layout area can be suppressed.

Moreover, from the viewpoint of noise as well, as program write is not performed at a time over the entire memory mat, voltage drop due to parasitic resistance or noise such as coupling noise due to parasitic capacitance can be suppressed.

Namely, lower noise can be achieved by suppressing the write current amount.

Distribution of threshold voltages Vth of memory cells in the data write sequence according to the first embodiment of the present invention will be described with reference to FIG. 5.

Figure 5:
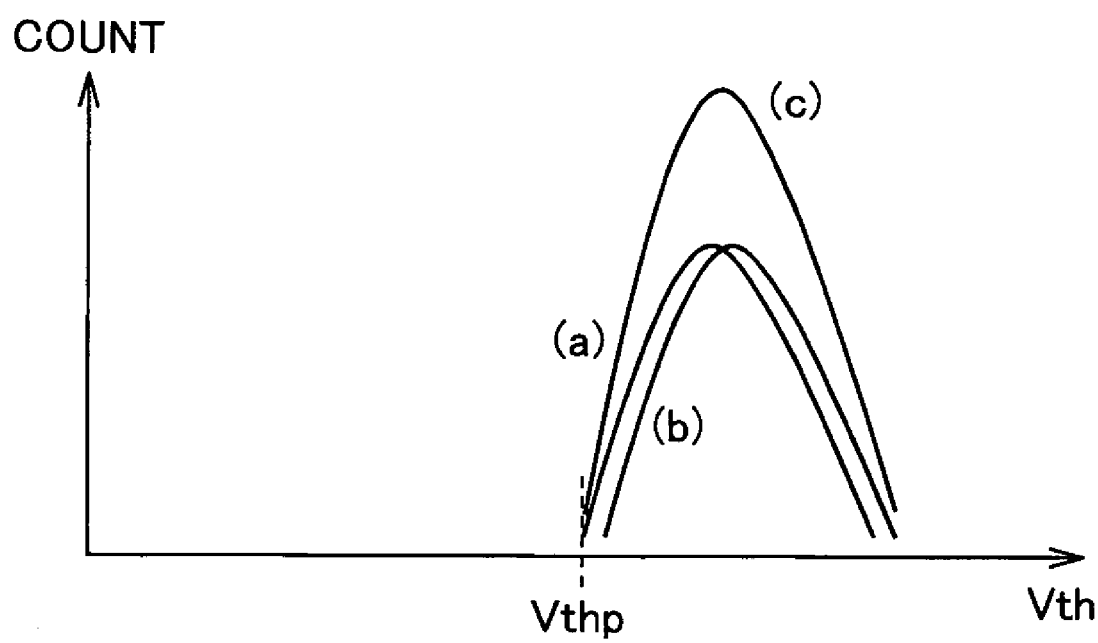
FIG. 5 illustrates distribution of threshold voltages of memory cells in the data write sequence according to the first embodiment of the present invention.
Figure 8:
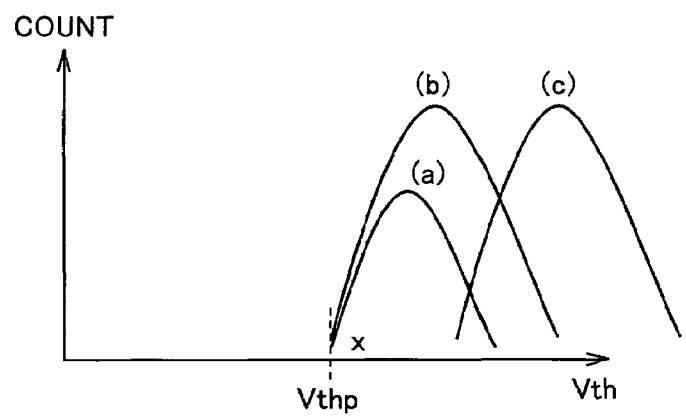
FIG. 8 illustrates spread of distribution of threshold voltages of memory cell transistors.
Figure 9:
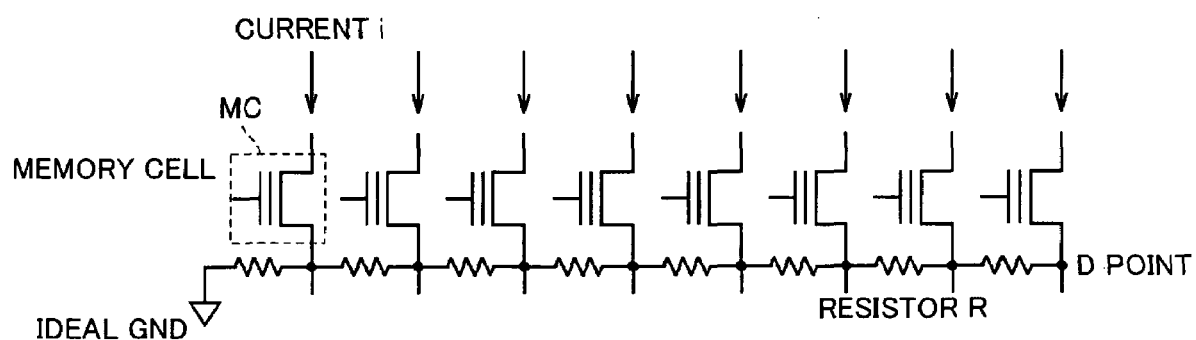
FIG. 9 illustrates voltage drop due to parasitic resistance when a current is simultaneously fed to a plurality of memory cell transistors.
Figure 10A:
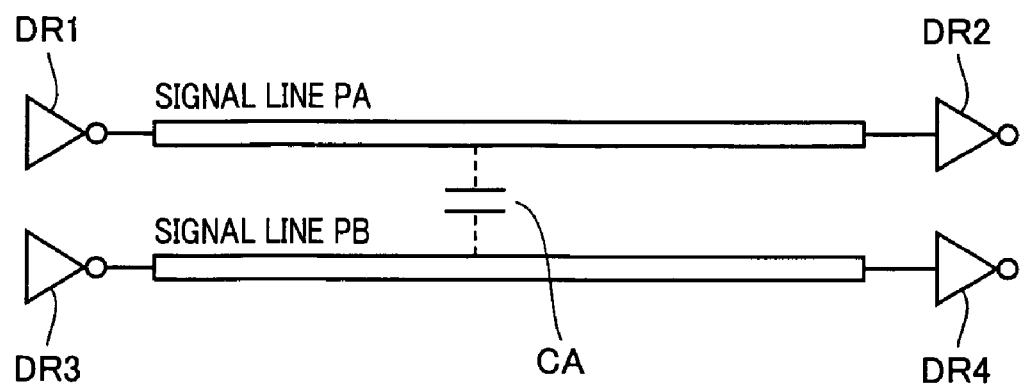
FIGS. 10A and 10B illustrate coupling noise between signal lines.
Figure 10B:
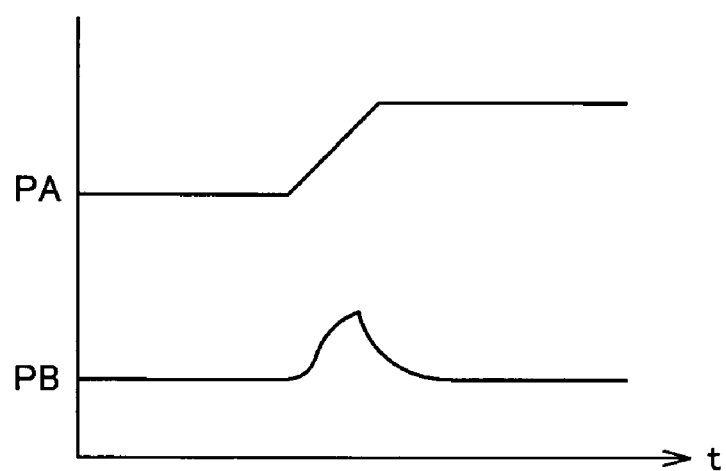

As shown in FIG. 5, the verify operation is performed for each memory mat and program write is performed for each memory mat. Therefore, spread of distributions (a) to (c) of threshold voltages Vth is not as great as in a conventional example described in connection with FIG. 8, because the number of data write target bits is half that in the entire memory array. Thus, narrower distribution width of the threshold voltages can be achieved.

Second Embodiment

A data write sequence according to a second embodiment of the present invention will be described with reference to FIG. 6.

Figure 6:
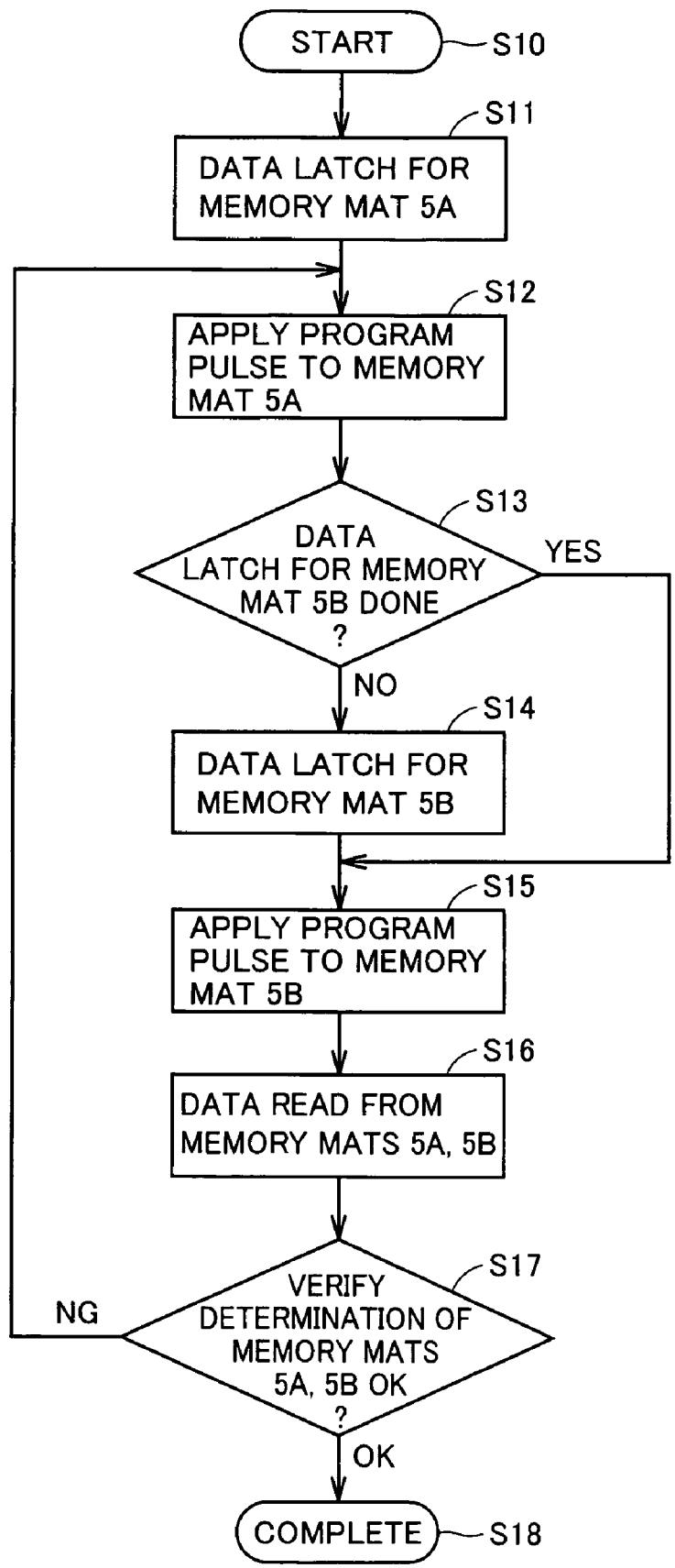
FIG. 6 is a flowchart illustrating a data write sequence according to a second embodiment of the present invention.

Referring to FIG. 6, when the data write sequence according to the second embodiment of the present invention is started (step S10), first, write data WDTA is latched in data latch circuit 40A corresponding to memory mat 5A, as described above (step S11). Namely, command control portion 100 outputs write data WDTA to write buffer 102. Then, it is assumed that write data WDTA for data write is output from write buffer 102 to data latch circuit 40A and held in data latch circuit 40A.

Thereafter, the program pulse is applied to memory mat 5A (step S12). Here, it is assumed that row selection by row decoder 10 and column selection by column decoder 15 for memory mat 5A are performed in response to the input address signal. Command control portion 100 outputs activation signal WDEA to write driver band 25A. In response to this, write driver band 25A performs parallel data write into the selected row in memory mat 5A that has been selected by row decoder 10, via selection gate 20A in accordance with the write data latched in data latch circuit 40A. As described above, in the data write sequence according to the embodiment of the present invention, the selection operation is performed on the plurality of memory mats based on designation of an identical address in response to the input address signal. Therefore, in memory mat 5B as well, row selection by row decoder 10 and column selection by column decoder 15 are performed as in memory mat 5A, however, data write to memory mat 5B is not performed in parallel.

Then, whether write data WDTB has been latched in data latch circuit 40B corresponding to memory mat 5B is determined (step S13).

If write data WDTB has been latched in data latch circuit 40B corresponding to memory mat 5B in step S13 (data latched), the process proceeds to step S15.

On the other hand, if write data WDTB has not been latched in data latch circuit 40B corresponding to memory mat 5B in step S13, write data WDTB is latched in data latch circuit 40B corresponding to memory mat 5B (step S14). Namely, command control portion 100 outputs write data WDTB to write buffer 103. Then, it is assumed that write data WDTB for data write is output from write buffer 103 to data latch circuit 40B and held in data latch circuit 40B. In the present example, a configuration in which whether write data WDTB has been latched in data latch circuit 40B is determined in step S13 following step S12, write data WDTB for data write is output from write buffer 103 to data latch circuit 40B, and data latch circuit 40B latches write data WDTB in step S14 is described, however, the order (timing) is not particularly limited as such, and processing in step S14 may be performed at any time before step S15 in which the program pulse is applied to memory mat 5B. For example, processing in step S14 may be performed after step S11. Alternatively, step S14 may be performed before step S11. In such a case, the determination processing in step S13 is not necessary. In addition, in the present example, a configuration in which write data WDTA, WDTB are output from write buffers 102, 103 to data latch circuits 40A, 40B at different timing respectively is described, however, write data WDTA, WDTB may be output to data latch circuits 40A, 40B at the same timing.

Thereafter, the program pulse is applied to memory mat 5B (step S15). Here, as described above, row selection by row decoder 10 and column selection by column decoder 15 for memory mat 5B has been performed in response to the input address signal. Command control portion 100 outputs activation signal WDEB to write driver band 25B. In response to this, write driver band 25B performs parallel data write into the selected row in memory mat 5B that has been selected by row decoder 10, via selection gate 20B in accordance with write data WDTB latched in data latch circuit 40B.

Thereafter, data read from the memory cells that are the data write target bits of memory mats 5A and 5B is performed (step S16). Namely, a verify operation in which data read and verify determination of memory mats 5A and 5B are carried out is performed. Command control portion 100 outputs activation signals SAEA and SAEB to sense amplifier bands 30A and 30B respectively. In response to this, sense amplifier bands 30A and 30B perform parallel data read from the memory cells that are the data write target bits via selection gates 20A and 20B. The data read by sense amplifiers 30A and 30B are input to verify circuits 104 and 105 as read data MDTA and MDTB, respectively.

Thereafter, verify determination of memory mats 5A and 5B is performed and whether verify determination is OK or not (whether verify passes or not) is determined (step S17).

If verify determination of memory mats 5A and 5B is OK in step S17, the process proceeds to next step S18 and the data write sequence ends (the data write sequence is completed).

On the other hand, if verify determination is NG in step S17, the process returns to step S12.

Here, whether verify determination of memory mats 5A and 5B is OK or not is determined based on comparison, that is, based on whether read data MDTA and MDTB output from sense amplifier bands 30A and 30B and received by verify circuits 104 and 105 respectively match with write data WDTA and WDTB provided from command control portion 100 respectively. It the data match, verify determination is OK, as it has been determined that desired data write to the memory cell which is the data write target bit had been completed, and if the data do not match, verify determination is NG.

In step S17, if verify determination of at least one memory cell which is the data write target bit of memory mats 5A and 5B is NG, the process returns to step S12 and verify write in which the program pulse described above is applied to each of memory mat 5A and 5B is performed again. Specifically, initially, in step S12, command control portion 100 outputs activation signal WDEA to write driver band 25A for performing verify write, based on verify determination (result of verify) from verify circuit 104.

Then, by repeating step S12 to step S17, verify determination of all memory cells that are the data write target bits in memory mats 5A and 5B is finally OK, and the process proceeds to step S18.

If verify determination is NG in step S17 and the program pulses are applied again to memory mats 5A and 5B, the process proceeds to step S15, because the write data has already been latched in data latch circuit 40B corresponding to memory mat 5B in step S13.

Therefore, in the data write sequence according to the second embodiment of the present invention, the program pulse is sequentially applied to memory mats 5A and 5B in such a manner that the program pulse is applied to memory mat 5A and thereafter the program pulse is applied to memory mat 5B. Namely, data write and verify write into memory mats 5A and 5B are performed at timing different from each other.

Meanwhile, data read and verify determination of memory mats 5A and 5B are performed in parallel.

Therefore, the data write sequence according to the second embodiment of the present invention achieves improved resistance to noise by performing data write and verify write in which the program pulse is sequentially applied to memory mats 5A and 5B so that a consumed current involved with application of the program pulse is decreased as compared with an example where data write and verify write are performed in parallel. Here, as data read and verify determination are performed in parallel on memory mats 5A and 5B, the program pulses are applied to memory mats 5A and 5B until verify of all data write target bits passes, and hence threshold values Vth tend to be distributed over a wider area than in the first embodiment; however, data write at high speed can be achieved by performing data read and verify determination in parallel as described above.

In addition, as described in the first embodiment, since data storage is not performed at a time over the entire memory mat, an amount of current (write current amount) that flows at a time can be suppressed, it is not necessary to enhance supply capability of the charge pump, and the layout area can also be made smaller.

In addition, from the viewpoint of noise as well, as described in the first embodiment, since data storage is not performed at a time over the entire memory mat, voltage drop due to parasitic resistance or noise such as coupling noise due to parasitic capacitance can be suppressed.

Third Embodiment

A data write sequence of a non-volatile semiconductor memory device according to a third embodiment of the present invention will be described with reference to FIG. 7.

Figure 7:
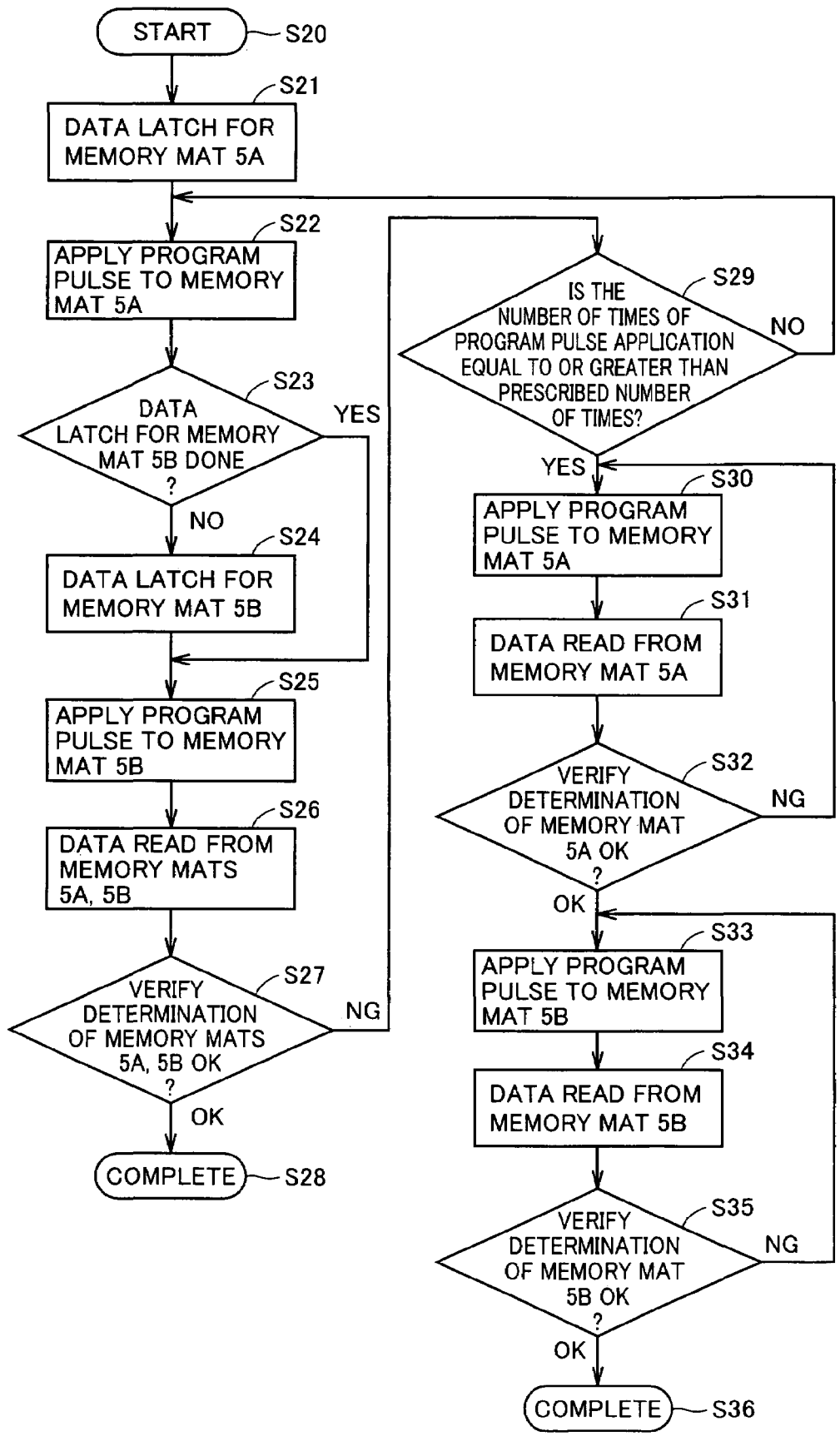
FIG. 7 is a flowchart illustrating a data write sequence of the non-volatile semiconductor memory device according to the embodiment of the present invention.

Referring to FIG. 7, when the data write sequence according to the third embodiment of the present invention is started (step S20), first, write data WDTA is latched in data latch circuit 40A corresponding to memory mat 5A, as described above (step S21). Namely, command control portion 100 outputs write data WDTA to write buffer 102. Then, it is assumed that write data WDTA for data write is output from write buffer 102 to data latch circuit 40A and held in data latch circuit 40A.

Thereafter, the program pulse is applied to memory mat 5A (step S22). Here, it is assumed that row selection by row decoder 10 and column selection by column decoder 15 for memory mat 5A are performed in response to the input address signal. Command control portion 100 outputs activation signal WDEA to write driver band 25A. In response to this, write driver band 25A performs parallel data write into the selected row in memory mat 5A that has been selected by row decoder 10, via selection gate 20A in accordance with the write data latched in data latch circuit 40A. As described above, in the data write sequence according to the embodiment of the present invention, the selection operation is performed on the plurality of memory mats based on designation of an identical address in response to the input address signal. Therefore, in memory mat 5B as well, row selection by row decoder 10 and column selection by column decoder 15 are performed as in memory mat 5A, however, data write to memory mat 5B is not performed in parallel.

Then, whether write data WDTB has been latched in data latch circuit 40B corresponding to memory mat 5B is determined (step S23).

If write data WDTB has been latched in data latch circuit 40B corresponding to memory mat 5B in step S23 (data latched), the process proceeds to step S25.

On the other hand, if write data WDTB has not been latched in data latch circuit 40B corresponding to memory mat 5B in step S23, write data WDTB is latched in data latch circuit 40B corresponding to memory mat 5B (step S24). Namely, command control portion 100 outputs write data WDTB to write buffer 103. Then, it is assumed that write data WDTB for data write is output from write buffer 103 to data latch circuit 40B and held in data latch circuit 40B. In the present example, a configuration in which whether write data WDTB has been latched in data latch circuit 40B is determined in step S23 following step S22, write data WDTB for data write is output from write buffer 103 to data latch circuit 40B, and data latch circuit 40B latches write data WDTB in step S24 is described, however, the order (timing) is not particularly limited as such, and processing in step S24 may be performed at any time before step S25 in which the program pulse is applied to memory mat 5B. For example, processing in step S24 may be performed after step S21. Alternatively, step S24 may be performed before step S21. In such a case, the determination processing in step S23 is not necessary. In addition, in the present example, a configuration in which write data WDTA, WDTB are output from write buffers 102, 103 to data latch circuits 40A, 40B at different timing respectively is described, however, write data WDTA, WDTB may be output to data latch circuits 40A, 40B at the same timing.

Thereafter, the program pulse is applied to memory mat 5B (step S25). Here, as described above, row selection by row decoder 10 and column selection by column decoder 15 for memory mat 5B has been performed in response to the input address signal. Command control portion 100 outputs activation signal WDEB to write driver band 25B. In response to this, write driver band 25B performs parallel data write to the selected row in memory mat 5B that has been selected by row decoder 10, via selection gate 20B in accordance with write data WDTB latched in data latch circuit 40B.

Thereafter, data read from the memory cells that are the data write target bits of memory mats 5A and 5B is performed (step S26). Namely, a verify operation in which data read and verify determination of memory mats 5A and 5B are carried out is performed. Command control portion 100 outputs activation signals SAEA and SAEB to sense amplifier bands 30A and 30B respectively. In response to this, sense amplifier bands 30A and 30B perform parallel data read from the memory cells that are the data write target bits via selection gates 20A and 20B. The data read by sense amplifiers 30A and 30B are input to verify circuits 104 and 105 as read data MDTA and MDTB, respectively.

Thereafter, verify determination of memory mats 5A and 5B is performed and whether verify determination is OK or not (whether verify passes or not) is determined (step S27).

If verify determination of memory mats 5A and 5B is OK in step S27, the process proceeds to next step S28 and the data write sequence ends (the data write sequence is completed). On the other hand, if verify determination is NG in step S27, the process proceeds to step S29. Here, whether verify determination of memory mats 5A and 5B is OK or not is determined based on comparison, that is, based on whether read data MDTA and MDTB output from sense amplifier bands 30A and 30B and received by verify circuits 104 and 105 respectively match with write data WDTA and WDTB provided from command control portion 100 respectively. If the data match, verify determination is OK, as it has been determined that desired data write to the memory cell which is the data write target bit had been completed, and if the data do not match, verify determination is NG.

Then, whether the number of times of application of the program pulse to memory mats 5A and 5B is equal to or greater than a prescribed number of times is determined (step S29).

If the number of times of application of the program pulse to memory mats 5A and 5B is equal to or greater than the prescribed number of times in step S29, the process proceeds to next step S30.

On the other hand, if the number of times of application of the program pulse is smaller than the prescribed number of times in step S29, the process returns to step S22, and verify write in which the program pulse described above is applied to each of memory mats 5A and 5B is performed again. Specifically, in step S22, command control portion 100 outputs activation signal WDEA to write driver band 25A for performing verify write, based on verify determination (result of verify) from verify circuit 104.

When the number of times of application of the program pulse to memory mats 5A and 5B is equal to or greater than the prescribed number of times as a result of repetition of step S22 to step S29, the process proceeds to step S30.

The operation performed in step S22 to step S27 is the same as in the data write sequence described in the second embodiment. Application of the program pulse in data write and verify write is sequentially performed for each of memory mats 5A and 5B. Data read and verify determination are performed in parallel for memory mats 5A and 5B.

Then, when the program pulse is applied to memory mats 5A and 5B the prescribed number of times or more, verify write in which the program pulse is applied to memory mat 5A is performed (step S30). Specifically, command control portion 100 outputs activation signal WDEA to write driver band 25A for performing verify write, based on verify determination (result of verify) from verify circuit 104.

Thereafter, data read as described above from the memory cell which is the data write target bit in memory mat 5A is performed (step S31). Namely, the verify operation in which data read and verify determination of memory mat 5A are carried out is performed.

Thereafter, verify determination of memory mat 5A described above is performed (step S31), and whether verify determination is OK or not (verify passes or not) is determined (step S32).

If verify determination of memory mat 5A is OK in step S32, the process proceeds to next step S33, and when verify determination is NG, the process returns to step S30.

In step S32, as described above, if verify determination of at least one memory cell which is the data write target bit of memory mat 5A is NG, the process returns to step S30 and verify write in which the program pulse described above is applied is performed again.

Then, after verify determination of all memory cells that are the data write target bits in memory mat 5A is finally OK by repeating step S30 to step S32, the process proceeds to next step S33.

Thereafter, in step S33, verify write in which the program pulse is applied to memory mat 5B is performed as described above (step S33). Specifically, command control portion 100 outputs activation signal WDEB to write driver band 25B for performing verify write, based on verify determination (result of verify) from verify circuit 105.

Thereafter, data read as described above from the memory cell which is the data write target bit in memory mat 5B is performed (step S34). Namely, the verify operation in which data read and verify determination of memory mat 5B are carried out is performed.

Thereafter, verify determination of memory mat 5B as described above is performed, and whether verify determination is OK or not (verify passes or not) is determined (step S35).

If verify determination of memory mat 5B is OK in step S35, the process proceeds to next step S36, and the data write sequence ends (the data write sequence is completed).

On the other hand, if verify determination is NG in step S35, the process returns to step S33.

If verify determination of at least one memory cell which is the data write target bit of memory mat 5B is NG in step S35, the process returns to step S33 and verify write in which the program pulse described above is applied is performed again. Then, by repeating step S33 to step S35, verify determination of all memory cells that are the data write target bits in memory mat 5B is finally OK, and the process proceeds to step S36.

Step S30 to step S35 are the same as those in the data write sequence described in the first embodiment, and data storage in memory mat 5B is performed after data storage in memory mat 5A is completed. Namely, when there are a plurality of memory mats obtained by dividing the memory array, data storage in each memory mat is sequentially performed.

Namely, in the data write sequence according to the third embodiment of the present invention, in the former stage, a high-speed data write sequence is performed as described in the second embodiment, and in the latter stage after the program pulse is applied the prescribed number of times or more, the data write sequence described in the first embodiment in which data storage in each memory mat is sequentially carried out is performed.

Therefore, in the data write sequence according to the third embodiment of the present invention, in the former stage in which application of the program pulse a plurality of times is highly likely necessary, the high-speed data write sequence according to the second embodiment in which data read and verify determination are carried out in parallel is performed. Then, in the latter stage, data read and verify determination of a memory cell in each memory mat, of which threshold voltage has been shifted to some extent, are performed sequentially for each memory mat. Thus, spread of distribution of threshold voltages Vth of the data write target bits in each memory mat can be suppressed.

As described in the first embodiment, data write at high speed can be performed, while suppressing spread of threshold voltage Vth distribution.

In addition, as described in the first embodiment, since data write is not performed at a time over the entire memory mat, an amount of current (write current amount) that flows at a time can be suppressed, it is not necessary to enhance supply capability of the charge pump, and the layout area can also be made smaller.

In addition, from the viewpoint of noise as well, as described in the first embodiment, since data storage is not performed at a time over the entire memory mat, voltage drop due to parasitic resistance or noise such as coupling noise due to parasitic capacitance can be suppressed.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor memory device, comprising:
  a memory array having a plurality of memory cells and divided into first and second memory mats;
  a selection circuit designating prescribed areas having an identical address, of respective said first and second memory mats of said memory array, that are data write targets, based on external address input;
  first and second data latch portions holding first and second write data groups defining application of program pulses to memory cells in the prescribed areas of said first and second memory mats designated by said selection circuit, respectively;
  first and second write drivers provided corresponding to said first and second data latch portions respectively, for applying the program pulses to the memory cells included in selected said prescribed areas in accordance with said first and second write data groups;
  a write/verify control portion for controlling at least one of said first and second write drivers to perform data write and verify write in which the program pulse is applied to the memory cell included in said selected prescribed area; and
  a sense amplifier portion for performing data read after said data write and said verify write into the memory cell included in said selected prescribed area that is said data write target;
  said write/verify control portion giving an instruction to perform data write into the prescribed area of one of said first and second memory mats based on said write data group held in one of said first and second data latch portions, and repeatedly giving an instruction to perform said verify write into the memory cell included in said selected prescribed area until verify is completed, based on a result of verify obtained based on comparison between a data group read by said sense amplifier portion from the memory cell included in said selected prescribed area and said write data group, and in a write sequence, said write/verify control portion giving an instruction to perform data write into the memory cell included in the prescribed area of said second memory mat after verify of the memory cell included in the prescribed area of said first memory mat is completed.

2. A semiconductor memory device, comprising:

a memory array having a plurality of memory cells and divided into first and second memory mats;

a selection circuit designating prescribed areas having an identical address, of respective said first and second memory mats of said memory array, that are data write targets, based on external address input;

first and second data latch portions holding first and second write data groups defining application of program pulses to memory cells in the prescribed areas of said first and second memory mats designated by said selection circuit, respectively;

first and second write drivers provided corresponding to said first and second data latch portions respectively, for applying the program pulses to the memory cells included in selected said prescribed areas in accordance with said first and second write data groups; and a write control portion for controlling at least one of said first and second write drivers to perform data write in which the program pulse is applied to the memory cell included in said selected prescribed area;

in a write sequence, said write control portion giving an instruction to perform data write in which the program pulses are applied at different timing to one and another of the memory cells included in said selected prescribed areas of said first and second memory mats.

3. The semiconductor memory device according to claim 2, wherein said write control portion controls at least one of said first and second write drivers to further perform verify write in which the program pulse is applied again at different timing to the memory cell included in said selected prescribed area, said semiconductor memory device further comprises a sense amplifier portion for performing data read after said data write and said verify write into the memory cell included in said selected prescribed area that is said data write target, and said write control portion gives an instruction to perform said verify write into the memory cell included in said selected prescribed area based on a result of verify obtained based on comparison between a data group read by said sense amplifier portion from the memory cell included in said selected prescribed area and at least one of said first and second write data groups.

4. The semiconductor memory device according to claim 3, wherein said sense amplifier portion includes first and second sense amplifier circuits provided corresponding to said first and second memory mats respectively, for performing parallel data read after said data write and said verify write into the memory cell included in said selected prescribed area that is said data write target, and said semiconductor memory device further comprises first and second verify circuits provided corresponding to said first and second memory mats respectively, for outputting in parallel results of verify based on comparison between the data groups read by respective said first and second sense amplifier circuits from the memory cells included in said selected prescribed areas and said first and second write data groups, respectively.

5. The semiconductor memory device according to claim 3, wherein said sense amplifier portion includes first and second sense amplifier circuits provided corresponding to said first and second memory mats respectively, for performing data read after said data write and said verify write into the memory cell included in said selected prescribed area that is said data write target, said semiconductor memory device further comprises first and second verify circuits provided corresponding to said first and second memory mats respectively, for outputting results of verify based on comparison between the data groups read by respective said first and second sense amplifier circuits from the memory cells included in said selected prescribed areas and said first and second write data groups, respectively, and said write control portion gives an instruction to perform, prescribed number of times, said verify write into the memory cells included in said selected prescribed areas of said first and second memory mats based on the results of verify output in parallel from said first and second verify circuits, thereafter repeatedly gives an instruction to perform said verify write into the memory cell included in the prescribed area of said first memory mat until verify is completed based on the result of verify obtained based on comparison between the data group read by said first sense amplifier circuit from the memory cell included in said selected prescribed area and said first write data group, and gives an instruction to perform said verify write into the memory cell included in the prescribed area of said second memory mat after verify of the memory cell included in the prescribed area of said first memory mat is completed.

6. A method of writing data in a semiconductor memory device including a memory array having a plurality of memory cells and divided into first and second memory mats, a selection circuit designating prescribed areas having an identical address, of respective said first and second memory mats of said memory array, that are data write targets, based on external address input, first and second data latch portions holding first and second write data groups defining application of program pulses to memory cells in the prescribed areas of said first and second memory mats designated by said selection circuit respectively, first and second write drivers provided corresponding to said first and second data latch portions respectively, for applying the program pulses to the memory cells included in selected said prescribed areas in accordance with said first and second write data groups, a write/verify control portion for controlling at least one of said first and second write drivers to perform data write and verify write in which the program pulse is applied to the memory cell included in said selected prescribed area, first and second sense amplifier circuits for performing data read after said data write and said verify write into the memory cell included in said selected prescribed area that is said data write target, and first and second verify circuits provided corresponding to respective said first and second sense amplifier circuits, for performing verify determination in which results of verify are output based on comparison between data groups read by respective said first and second sense amplifier circuits and first and second write data groups, comprising the steps of:

inputting said first and second write data groups to said first and second data latch portions, respectively;

instructing said first write driver to perform said data write into the memory cell of the first memory mat included in said selected prescribed area in accordance with said first write data group held in said first data latch portion;

performing said verify determination in which said result of verify is output from said first verify circuit based on comparison between the data group read by said first sense amplifier circuit from the memory cell of the first memory mat included in said selected prescribed area and said first write data group;

repeatedly instructing said first write driver to perform said verify write into the memory cell of the first memory mat included in said selected prescribed area and performing said verify determination until verify is completed, based on said result of verify from said first verify circuit; and instructing said second write driver to perform data write into the memory cell included in the prescribed area of said second memory mat after verify of the memory cell of said first memory mat included in the prescribed area is completed.

7. A method of writing data in a semiconductor memory device including a memory array having a plurality of memory cells and divided into first and second memory mats, a selection circuit designating prescribed areas having an identical address, of respective said first and second memory mats of said memory array, that are data write targets, based on external address input, first and second data latch portions holding first and second write data groups defining application of program pulses to memory cells in the prescribed areas of said first and second memory mats designated by said selection circuit respectively, first and second write drivers provided corresponding to said first and second data latch portions respectively, for applying the program pulses to the memory cells included in selected said prescribed areas in accordance with said first and second write data groups, and a write control portion for controlling at least one of said first and second write drivers to perform data write in which the program pulse is applied to the memory cell included in said selected prescribed area, comprising the steps of:

inputting said first and second write data groups to said first and second data latch portions, respectively; and instructing said first and second write drivers to perform data write in which the program pulses are applied to the memory cells included in said selected prescribed areas of said first and second memory mats in accordance with said first and second write data groups input to said first and second data latch portions; and said first and second write drivers being instructed to perform, at different timing, data write into the memory cells included in said selected prescribed areas of said first and second memory mats.

8. A method of writing data in a semiconductor memory device including a memory array having a plurality of memory cells and divided into first and second memory mats, a selection circuit designating prescribed areas having an identical address, of respective said first and second memory mats of said memory array, that are data write targets, based on external address input, first and second data latch portions holding first and second write data groups defining application of program pulses to memory cells in the prescribed areas of said first and second memory mats designated by said selection circuit respectively, first and second write drivers provided corresponding to said first and second data latch portions respectively, for applying the program pulses to the memory cells included in selected said prescribed areas in accordance with said first and second write data groups, a write/verify control portion for controlling at least one of said first and second write drivers to perform data write and verify write in which the program pulse is applied to the memory cell included in said selected prescribed area, first and second sense amplifier circuits for performing data read after said data write and said verify write into the memory cell included in said selected prescribed area that is said data write target, and first and second verify circuits provided corresponding to respective said first and second sense amplifier circuits, for performing verify determination in which results of verify are output based on comparison between read data groups from respective said first and second sense amplifier circuits and corresponding write data groups, comprising the steps of:

inputting said first and second write data groups to said first and second data latch portions, respectively;

instructing said first and second write drivers to perform, at different timing, said data write into the memory cells of said first and second memory mats included in said selected prescribed areas in accordance with said first and second write data groups held in said first and second data latch portions, respectively;

performing said verify determination in which said results of verify are output in parallel from said first and second verify circuits based on comparison between the data groups read by said first and second sense amplifier circuits from the memory cells of the first and second memory mats included in said selected prescribed areas and said first and second write data groups;

instructing said first and second write drivers to perform, at different timing, said verify write into the memory cells of the first and second memory mats included in said selected prescribed areas respectively, based on said results of verify from said first and second verify circuits;

repeating prescribed number of times the steps of performing said verify determination in which said results of verify are output in parallel from said first and second verify circuits and giving an instruction to perform, at different timing, said verify write into the memory cells of the first and second memory mats included in said selected prescribed areas;

performing said verify determination in which said result of verify is output from said first verify circuit, based on comparison between the data group read by said first sense amplifier circuit from the memory cell of the first memory mat included in said selected prescribed area and said first write data group, after sequentially repeating said steps said prescribed number of times;

instructing said first write driver to perform said verify write into the memory cell of the first memory mat included in said selected prescribed area, based on said result of verify from said first verify circuit;

sequentially repeating the steps of performing said verify determination in which said result of verify is output from said first verify circuit and giving an instruction to perform said verify write into the memory cell of the first memory mat included in said selected prescribed area until verify is completed; and giving an instruction to perform said verify write into the memory cell included in the prescribed area of said second memory mat after verify of the memory cell included in the prescribed area of said first memory mat is completed.

* * * * *